United States Patent [19]

Nguyen

[11] Patent Number: 5,011,785
[45] Date of Patent: Apr. 30, 1991

[54] INSULATOR ASSISTED SELF-ALIGNED GATE JUNCTION

[75] Inventor: Richard Nguyen, San Diego, Calif.

[73] Assignee: The United States of America as represented by the Secretary of the Navy, Washington, D.C.

[21] Appl. No.: 605,623

[22] Filed: Oct. 30, 1990

[51] Int. Cl.$^5$ ............................................. H01L 21/04
[52] U.S. Cl. ..................................... 437/41; 437/911; 357/22
[58] Field of Search ................. 437/41, 911; 357/22 I, 357/22 F, 22 J, 22 K

[56] References Cited

U.S. PATENT DOCUMENTS

| | | | |
|---|---|---|---|
| 4,048,712 | 9/1977 | Buiatti | 437/911 |
| 4,075,652 | 2/1978 | Umebachi et al. | 437/911 |
| 4,099,305 | 7/1978 | Cho et al. | 437/80 |
| 4,404,732 | 9/1983 | Andrade | 437/176 |
| 4,559,238 | 12/1985 | Bujatti et al. | 437/176 |
| 4,711,701 | 12/1987 | McLevige | 437/41 |
| 4,774,200 | 9/1988 | Nakajima et al. | 357/22 I |
| 4,863,879 | 9/1989 | Kwok | 437/41 |
| 4,895,811 | 1/1990 | Inoue | 437/911 |

FOREIGN PATENT DOCUMENTS

| | | | |
|---|---|---|---|
| 0133752 | 7/1985 | Japan | 437/41 |
| 0241980 | 10/1986 | Japan | 437/41 |
| 0092062 | 4/1988 | Japan | 437/41 |
| 0136575 | 6/1988 | Japan | 357/22 I |
| 0217977 | 8/1989 | Japan | 357/22 I |

Primary Examiner—Olik Chaudhuri
Assistant Examiner—Long Pham
Attorney, Agent, or Firm—Harvey Fendelman; Thomas Glenn Keough

[57] ABSTRACT

A high transconductance, low capacitance, low leakage compound semiconductor junction field effect transistor (JFET) enhances the low leakage current while having the advantages of a self-aligned JFET including low capacitance and low source-drain resistance. The diffused junction of the JFET is totally covered during the process of manufacture. An n channel on a substrate has a layer of photoresist placed over it and exposed to leave a predefined pattern of photoresist. The patterned photoresist is used as a mask so that part of the n-channel layer is etched down to a desired depth leaving a wedge-shaped region. A layer of insulator, such as silicon dioxide, is deposited over the entire substrate and sides of the w edge-shaped region in insulator regions. Next, the photoresist is then removed. A p+ diffusion or implant is performed in the wedge-shaped region to create a p+ n-junction system which is the gate region of the JFET. The p+ n junction system sides are covered the insulator regions of silicon dioxide unlike the opened-junction of the conventional self-aligned gate JFET. Next, the gate patterned metal is deposited on top of the p+ n junction system and partially on the silicon dioxide insulator regions. Using the patterned gate metal as a mask, the silicon dioxide layer is removed. Source and drain metals are then self-aligned evaporated. The JFET has potential use in microwave, millimeter-wave and optical electronic circuits.

11 Claims, 4 Drawing Sheets

INSULATOR ASSISTED SELF-ALIGNED GATE JUNCTION

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Usually the manufacture of a junction field effect transistor (JFET) follows an established routine of forming a drain, a source, and a gate on the surface of a semiconductor substrate or, in the case of a compound semiconductor JFET, on the surface of a semi-insulating substrate. Metallic ohmic contacts generally are used for the drain and source electrodes whereas a rectifying junction barrier contact is selected for the gate electrode. It has been found to be desirable to manufacture JFETs to have a short diffused gate junction and low electrical resistance between the source and the drain. Another design feature is to have the device structure be compatible with the conventional self-aligned gate structure and by applying the technique which can be inferred from the schematic depiction of FIG. 1.

A source contact and drain contact on mesa isolation MI on a semi-insulating indium phosphide substrate SI is fabricated with a self-aligned source and drain as depicted. However, this conventional fabrication technique creates the disadvantageous opened junction OJ between the gate and the substrate, as shown in FIG. 2. This is created when the laminated structure of FIG. 3 used in the construction of a self-aligned gate junction field effect transistor has a gate junction between opposite type semiconductors formed on an active channel layer by diffusion, or implantation, or epitaxial growth techniques. Following this formation, the gate metal is defined and used as a mask to etch away the unwanted semiconductor, in this case the p+ InP layer which was previously, uniformly layered across the active n InP channel, see FIG. 4A.

Noting FIG. 4B, the source and drain contacts were deposited. However, the etching technique which is used to etch away the unwanted semiconductor layer p+ InP still left an open-junction OJ between two different types of semiconductor which results in a poor performing transistor with respect to objectional capacitance, resistance and leakage current.

In other words, the conventional structure according to the technique of FIG. 1 et seq. has the disadvantage of creating an opened-junction, OJ, between the gate and the substrate which has been discovered to tend to create a large leakåge current which inherently degrades the performance of the conventionally fabricated JFETs.

Thus, a continuing need exists in the state of the art for a method of making a JFET which assures that the JFET has a high transconductance, low capacitance, with low leakage to enable its satisfactory use in microwave, millimeter-wave and optoelectronic circuits.

SUMMARY OF THE INVENTION

The present invention is directed to providing an improved process for manufacturing a high transconductance, low capacitance, low leakage compound semiconductor JFET. Providing a semi-insulating substrate allows the forming of an n channel thereon. Placing a photoresist layer in a predetermine pattern to function as a mask and etching away of the n channel layer to a desired depth permits a depositing of a layer of insulator over the entire substrate followed by a removal of the photoresist, such as by acetone. P+ diffusion or implant in a wedge-shaped region creates a p+n junction in the unmasked (by silicone dioxide layer) semiconductor area which is the gate region of the JFET. Covering the p+ n unction by the silicon dioxide mask assures the creation of a structure which is unlike the open-junction of the conventional self-aligned gate JFET. Depositing a gate patterned metal layer on top of the wedge-shaped p+ diffused area which partially extends onto the sides of the silicon dioxide layer allows removal of the oxide layer down to the n channel and source and drain metals are self-aligned evaporated on the n channel layer and a silicon dioxide layer covered diffused junction self-aligned gate JFET is created without the opened-junction region such as found in conventional JFETs.

An object of the invention is to improve a method of manufacturing a junction field effect transistor.

Another object is to provide an improved self-aligned JFET having its diffused junction totally covered during all the manufacturing processes.

Another object is to provide a method for making a self-aligned JFET which enhances low leakage current.

Still another object is to provide an improved method for making a self-aligned JFET that has a low capacitance and low source-drain resistance.

These and other objects of the invention will become more readily apparent from the ensuing specifications and drawings when taken in conjunction with the appended claims.

DESCRIPTION OF THE PREFERRED EMBODIMENT

Referring now to FIGS. 5-11, an improved method for fabricating a self-aligned gate junction field effect transistor is schematically set forth in sufficient detail to enable one skilled in the art to which this invention pertains to make and use the disclosed inventive concept. Details concerning well-known manufacturing expedients for accomplishing the various steps of the fabrication procedure have been dispensed with to avoid belaboring the obvious. One skilled in the art to which this invention pertains, having the teachings of this invention before him, can realize an improvement in a manufacturing method for a junction field effect transistor (JFET) that enhances a low leakage current while maintaining the advantages of a self-aligned JFET including low capacitance and low source-drain resistance.

Figure 1:
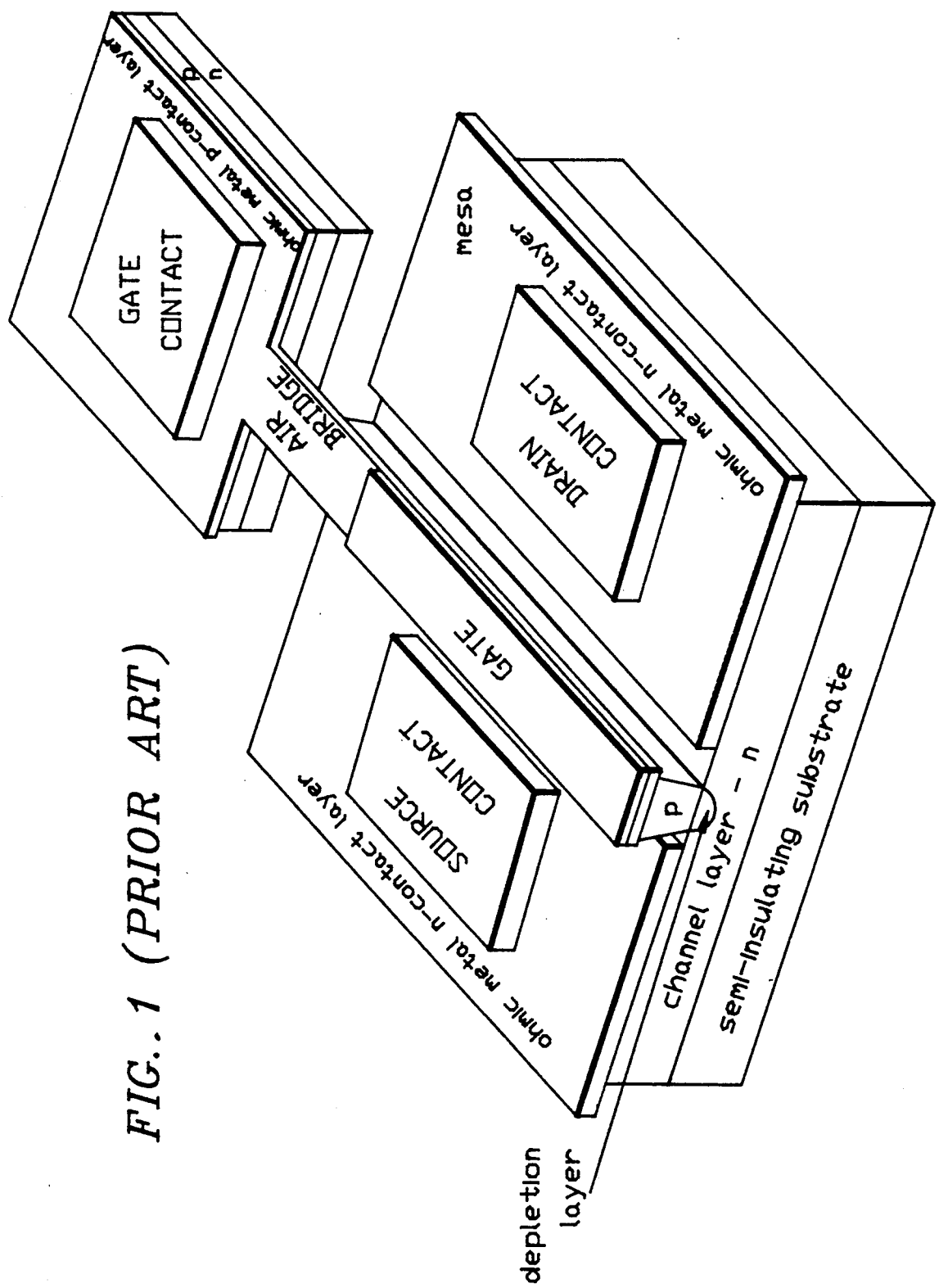
FIGS. 1, 2, 3, 4A and 4B depict a conventional , prior art manufacturing process for a contemporary junction field effect transistor.
Figure 2:
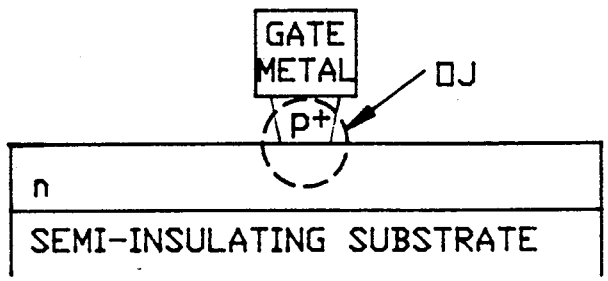
Figure 3:
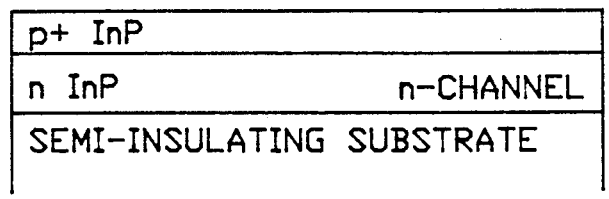
Figure 4A:
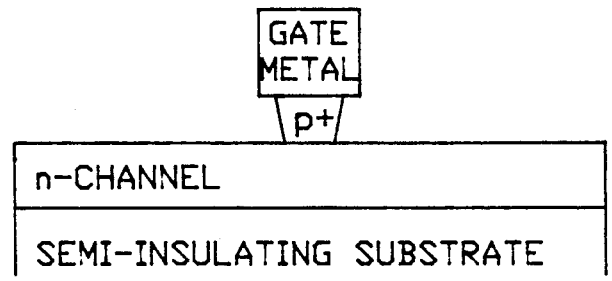
Figure 4B:
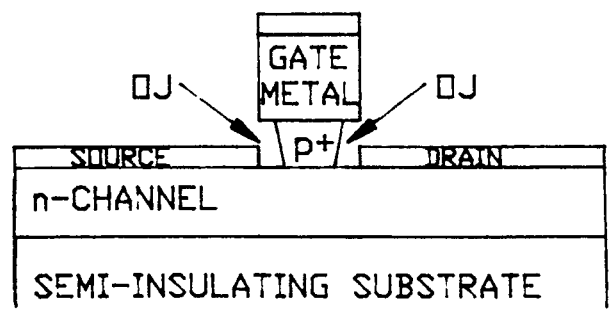
Figure 5:
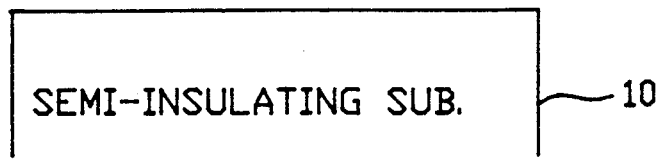
FIGS. 5-11 depict the improved method of this inventive concept for fabricating a self-aligned gate junction field effect transistor.

FIG. 5 shows a typical semi-insulating substrate 10 on which the JFET, in accordance with this inventive concept, is to be manufactured. The semi-insulative substrate can be one of many known and foreseeable anticipated materials selectable by a routineer for the practice of this invention. An n channel 11 of, for example, indium phosphide (InP) is formed by implantation, or epitaxial growth techniques, see FIG. 6.

Figure 7:
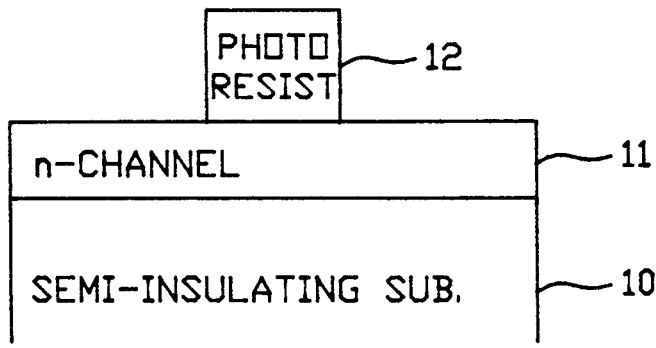

The next step in the process is represented in FIG. 7 and involves the placing of a photoresist layer in a predefined pattern on channel 11. Using pattern photoresist 12 as a mask, part of the n channel layer 11 is etched down to a predetermined layer depth 11a using a chemical etchant solution of 10% HIO₃ (Iodic acid) followed by a rinse in DI (deionized water). This leaves a projection 11b having a wedge-shaped cross-sectional appearance.

A silicon dioxide insulator layer 13 made up of portions 13a, 13b and 13c is deposited over the entire substrate. The silicon dioxide layer is formed using a chemical vapor deposition or sputtering method to deposit on the entire wafer. Portion 13c is removed by being lifted-off in an acetone ultrasonic bath (positive photoresist dissolved in acetone). Next, the photoresist 12 is removed by an acetone bath, leaving portions 13a and 13b of the deposited silicon dioxide insulator layer covering the top of n channel layer 11a.

Figure 8:
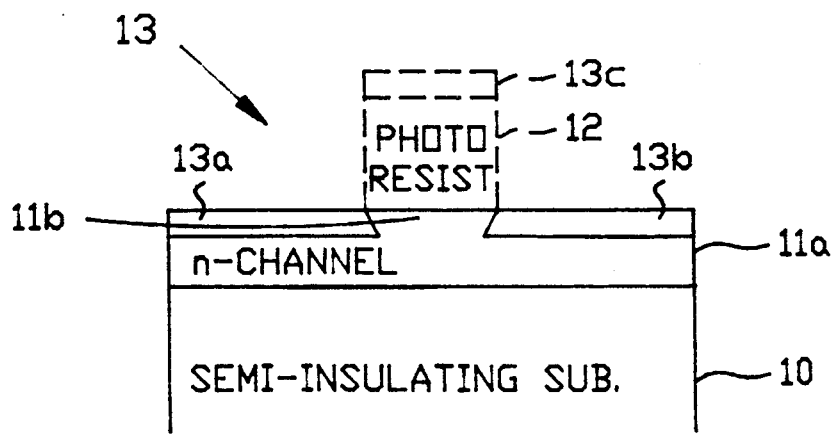

At this point in the procedure a p+ diffusion or implant is performed in wedge-shaped region 11b of n channel layer 11a, see FIG. 8. This process is carried out using the close-tube diffusion technique. The wafer or sample is placed inside a closed chamber (vacuum environment) with the diffusion source (in this case, it is a zinc-arsenide compound in the powder form). For this particular small scale environment, the quartz test tube was used for the chamber. The sample or wafer was placed inside the tube, then the tube was connected to a vacuum pump unit to be pumped down to the vacuum state. The test tube was then heated up to a control temperature (540° C. for this case) to perform the diffusion process. The time and temperature were carefully studied for the reproducibility of the process to ensure the formation of the p+ only in the wedge-shaped region. A p-type source, such as berilium or magnesium is placed inside the wedged-region by using the ion-implantation technique. By controlling the dose and the energy of the implantation process the confinement of the p+ region inside of the wedge-shaped area is ensured.

The p+ diffusion or implant creates a p+ n junction system 11c in what was before designated wedge-shaped region 11b that had not been masked by the silicon dioxide layer 13a and 13b over the semiconductor area defined by n channel layer 11a.

Figure 9:
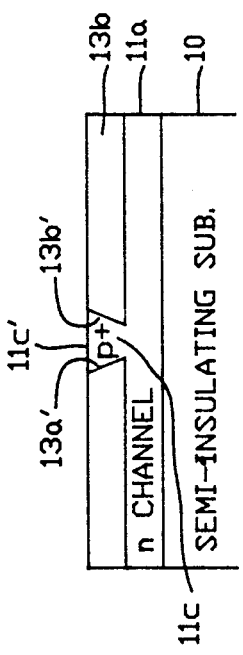

The p+ n junction system 11c is the gate region of the JFET, see FIG. 9. The sides of the p+ n junction are covered completely by silicon dioxide along sides 13a' and 13b' of silicon dioxide layer 13a and 13b. This complete coverage is unlike the open-junction of a conventional self-aligned gate JFET.

Figure 10:
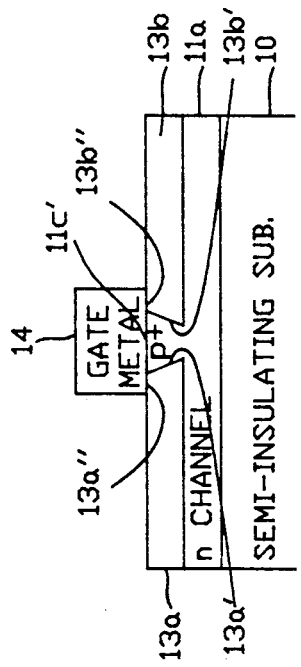
Figure 11:
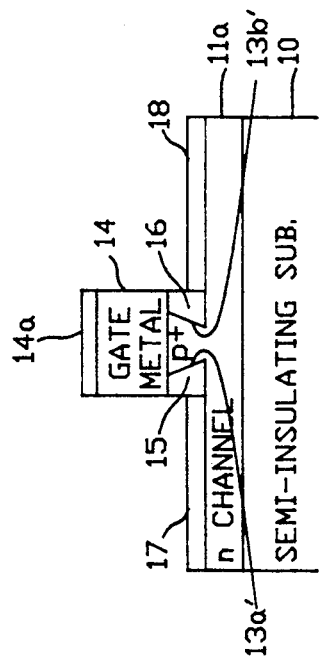

Referring to FIG. 10, the next step in the improved method is that a gate patterned metal is deposited on the top area 11c' of the p+ diffused junction system 11c and partially on silicon dioxide layer 13a and 13b on an area 13a" and 13b" using the conventional lift-off process.

At this point in the fabrication process the gate metal itself is used as a mask. The silicon dioxide insulator layers 13a and 13b are removed. The unwanted silicon dioxide outside of the gate area was removed using the dry etching technique. This process can be done in an anisotropic etching procedure using a reactive ion etching (RIE) or a sputtering system.

As a consequence, n channel layer 11a is exposed and silicon dioxide regions 15 and 16 remain enclosing the lateral dimensions of p+ n junction system 11c. In other words, after the oxide layers 13a and 13b have been removed, oxide layer portions 15 and 16 cover the diffused junction 11c completely along the side 13a' and 13b'.

Next, metal source and drain electrodes 17 and 18 as well a gate metal electrode 14a are to be formed by a self-aligned evaporation procedure. Using the conventional photoresist lift-off process, in this case, the deposited open area is between the source and the drain. Accordingly, the depositing of the appropriate electrode metals form the source electrode 17 and drain electrode 18 and a gate electrode 14a on gate metal 14.

Figure 6:
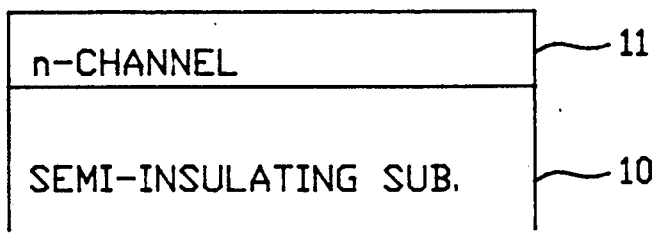
Figure 12:
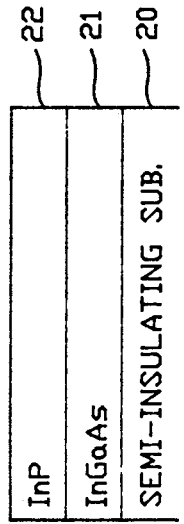
FIGS. 12-13 depict another method for fabricating a self-aligned gate junction field effect transistor.
Figure 13:
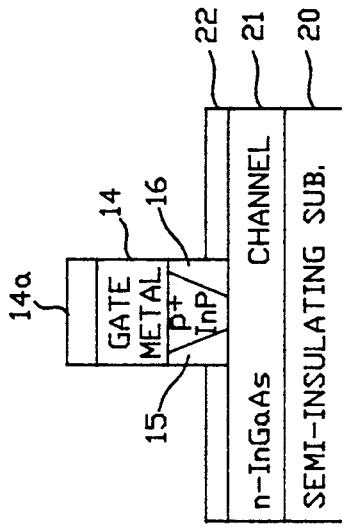

Referring now to FIGS. 12 and 13, a semi-insulating substrate 20 has an n channel 21 of InGaAs on which an InP p+ gate layer 22 is deposited. The p+ gate layer does not have to be of the same semiconductor material as the n channel 21 of the improved junction field effect transistor. A heterojunction system can be used in conjunction with the same fabrication process would greatly improve the performance of the device, such as InP/InGaAs heterojunction structure shown in FIG. 12. By using the InGaAs material as the channel layer, an InP selected diffuse and selected etch can be accurately affected to provide the structure depicted in FIG. 13 when the procedure described with respect to FIGS. 5-7 is followed. Of course, as will be apparent to one versed in this art, appropriate and suitable known expedients, such as the selection of the right etchants, solutions etc. for processing the different materials will have to be made to accommodate the invention's disclosed process to the different materials.

Obviously, many modifications and variations of the present invention are possible in the light of the above teachings. It is therefore to be understood that within the scope of the appended claims, the invention may be practiced otherwise than as specifically described.

I claim:

1. An improved process for fabricating a junction field effect transistor having a high transconductance, low capacitance and low leakage comprising:

providing a semi-insulating substrate having an n channel thereon;

placing a photoresist layer in a predetermine pattern on said n channel to function as a mask;

etching away of the masked n channel layer to a desired depth to define a wedge-shaped n region extending thereabove;

depositing a layer of insulator over the entire substrate including insulator regions of the deposited insulator that completely abut the sides of said wedge-shaped region; removing the photoresist layer, said insulator regions entirely covering the sides of said wedge-shaped region;

creating a p+n junction system by p+ diffusion in said wedge-shaped n region which is the gate region of the JFET, said insulator regions entirely covering the sides of said p+n junction system to distinguish from the open-junction of the conventional self-aligned gate JFET;

depositing a gate patterned metal layer on top of the wedge-shaped p+n junction system area which partially extends over said insulator regions of said deposited insulator;

removing said deposited insulator down to said n channel with the exception of said insulator regions; and evaporating source and drain metal electrodes on said n channel layer and gate metal electrodes on said wedge-shaped p+n junction system area to create a self-aligned gate JFET without an opened-junction region.

2. An improved process for fabricating a junction field effect transistor having a high transconductance, low capacitance and low leakage comprising:

providing a semi-insulating substrate having an n channel thereon;

placing a photoresist layer in a predetermine pattern on said n channel to function as a mask;

etching away of the masked n channel layer to a desired depth to define a wedge-shaped n region extending thereabove;

depositing a layer of insulator over the entire substrate including insulator regions of the deposited insulator that completely abut the sides of said wedge-shaped region; removing the photoresist layer, said insulator regions entirely covering the sides of said wedge-shaped region;

creating a p+n junction system by p+ implanting in said wedge-shaped n region which is the gate region of the JFET, said insulator regions entirely covering the sides of said p+n junction system to distinguish from the open-junction of the conventional self-aligned gate JFET;

depositing a gate patterned metal layer on top of the wedge-shaped p+n junction system area which partially extends over said insulator regions of said deposited insulator;

removing said deposited insulator down to said n channel with the exception of said insulator regions; and evaporating source and drain metal electrodes on said n channel layer and gate metal electrodes on said wedge-shaped p+n junction system area to create a self-aligned gate JFET without an opened-junction region.

3. An improved process according to claim 1 or 2 in which said n channel is InP.

4. An improved process according to claim 1 or 2 in which said deposited insulator is silicon dioxide.

5. An improved process according to claim 3 in which said deposited insulator is silicon dioxide.

6. An improved process according to claim 1 or 2 in which said n channel is InGaAs.

7. An improved process according to claim 1 or 2 in which said wedge-shaped region is InP.

8. An improved process according to claim 6 in which said wedge-shaped region is InP.

9. An improved process according to claim 1 or 2 in which said deposited insulator is silicon dioxide.

10. An improved process according to claim 6 in which said deposited insulator is silicon dioxide.

11. An improved process according to claim 7 in which said deposited insulator is silicon dioxide.

* * * * *